US006177317B1

(12) United States Patent
Huang et al.

(10) Patent No.: US 6,177,317 B1
(45) Date of Patent: Jan. 23, 2001

(54) METHOD OF MAKING NONVOLATILE MEMORY DEVICES HAVING REDUCED RESISTANCE DIFFUSION REGIONS

(75) Inventors: Chin-Yi Huang, Pao Shan; Huei Huarng Chen, Hsinchu; Yun Chang, Hsinchu County; Samuel C. Pan, Hsinchu, all of (TW)

(73) Assignee: Macronix International Co., Ltd. (TW)

( * ) Notice: Under 35 U.S.C. 154(b), the term of this patent shall be extended for 0 days.

(21) Appl. No.: 09/291,915

(22) Filed: Apr. 14, 1999

(51) Int. Cl.[7] ................................. H01L 21/8247
(52) U.S. Cl. ..................... 438/263; 438/296; 438/430
(58) Field of Search ................................... 438/257, 259, 438/262, 263, 264, 296, 430, 657

(56) References Cited

U.S. PATENT DOCUMENTS

| 4,597,060 | 6/1986 | Mitchell et al. | 365/185 |
|---|---|---|---|
| 4,833,098 | * 5/1989 | Kato | 438/430 |
| 5,278,438 | * 1/1994 | Kim et al. | 438/257 |
| 5,387,534 | * 2/1995 | Prall | 438/296 |
| 5,399,891 | 3/1995 | Yiu et al. | 257/316 |
| 5,453,391 | 9/1995 | Yiu et al. | 437/43 |
| 5,559,048 | * 9/1996 | Inoue | 438/259 |
| 5,696,019 | * 12/1997 | Chang | 438/257 |

OTHER PUBLICATIONS

Kobayashi et al., "A 0.24–$\mu m^2$ Cell Process with 0.18–$\mu m$ Width Isolation and 3–D Interpoly Dielectric Films for 1–Gb Flash Memories", Dec. 1997, IEDM Technical Digest, pp. 275–278.

* cited by examiner

Primary Examiner—Chandra Chaudhari
(74) Attorney, Agent, or Firm—Mark A. Haynes; Haynes & Beffel LLP (57) ABSTRACT

A method is described for manufacturing nonvolatile memory devices having reduced resistance diffusion regions. One embodiment of the method includes forming a multilayer structure over a substrate which includes a tunnel oxide layer, a polysilicon layer, and an etch stop layer. A photoresist masking process is performed on the multilayer structure to define gates of the nonvolatile memory device. A spacer layer is then deposited and etched back to form sidewall spacers adjacent the gates. The width of the sidewall spacers is used to define the width of the source and drain regions, and the width of trenches between the gates. Trenches are formed using a high selectivity etch which etches through the substrate faster than the sidewall spacers and the etch stop layer. A conductive layer is formed over the area of the device and etched to form the reduced resistance diffusion regions and the desired trench configuration. The trenches are then filled with an insulating material.

18 Claims, 10 Drawing Sheets

FIG. 1

Array circuit diagram of flash EPROM with isolation

Array circuit diagram of flash EPROM without isolation

METHOD OF MAKING NONVOLATILE MEMORY DEVICES HAVING REDUCED RESISTANCE DIFFUSION REGIONS

BACKGROUND OF THE INVENTION

1. Field of the Invention

The present invention is directed towards a method for manufacturing high density integrated circuit memory arrays. More particularly, the present invention is directed towards a method for manufacturing nonvolatile memory devices having reduced resistance diffusion regions.

2. Description of Related Art

Nonvolatile memory arrays typically use an implantation process to create diffusion regions with reduced resistance. The reduced resistance improves performance because the voltage drop is reduced, read current and read speed are enhanced, the threshold voltage distribution is tightened, and the program voltage on the drain side is reduced.

However, the implantation process is limited in how much the resistance can be reduced by both implant dose and depth. Because the implantation process is limited in implant dose, the diffusion regions are constrained to the kind of reduced resistances that can be achieved by doping a silicon substrate. Because the implantation process is limited in implant depth, only diffusion regions of limited thickness can be created. In addition, the implantation process requires a drying process, which increases the number of thermocycles and adversely affects device yield and performance.

What is needed is a method for manufacturing a nonvolatile memory device capable of producing diffusion regions with lower resistances than are possible with implantation processes. What is needed is a method for manufacturing a nonvolatile memory device capable of producing diffusion regions with greater thicknesses than are possible with implantation processes. What is needed is a method for manufacturing a nonvolatile memory device which can eliminate the need for an additional drying process required if an implantation process is used to create the diffusion regions.

SUMMARY OF THE INVENTION

The present invention is directed towards a method for manufacturing a nonvolatile memory device. The method comprises: providing a multilayer structure, the multilayer structure having a substrate, a tunnel oxide layer over the substrate, a polysilicon layer over the tunnel oxide layer, and an etch stop layer over the polysilicon layer; defining gates in the multilayer structure by using a photoresist mask layer to remove portions of the etch stop layer, polysilicon layer, and tunnel oxide layer to form openings in the multilayer structure; creating source/drain regions in the substrate by doping the substrate through the openings; forming sidewall spacers adjacent to the gates by forming a spacer layer in the openings and etching back the spacer layer, the sidewall spacers defining source regions, drain regions, and trench regions; forming trenches by removing portions of the substrate in the trench regions, the trenches extending deeper into the substrate than the source/drain regions; depositing a conductive material on sidewalls and bottoms of the trenches, forming diffusion regions by removing the conductive material from the bottoms of the regions, the diffusion regions being continuous with the source/drain regions; and filling the trenches with an insulating material.

DETAILED DESCRIPTION OF THE INVENTION

The method of the present invention reduces the diffusion region resistance by elongating the diffusion region and reducing the diffusion region resistance by depositing a highly conductive material on the trench sidewalls.

By depositing a highly conductive material on the side walls of the trenches formed by self-alignment etching, the buried diffusion area is elongated withotu increasing silicon area, since the buried diffusion area has been elongated along the trench depth instead of across silicon area. This reduces buried diffusion line resistance when the voltage drop is severe for high current applications, such as writing with hot-electron programming on EPROM or flash EPROM. This also enhances read current and read speed when a longer buried diffusion line is applied, beneficial for buried type MROM, EPROM, flash EPROM, and flash EEPROM. This also tightens the threshold voltage distribution when writing with hot-electron programming on EPROM or flash EPROM by inserting a high conductivity layer in the buried diffusion area, thus reducing the drain voltage difference between the first buried cell (first word-line cell) and the last cell (last word-line cell).

The method of the present invention may be used for buried type transistors such as mask ROM, EPROM, flash EPROM, and flash EEPROM devices.

Figure 1:
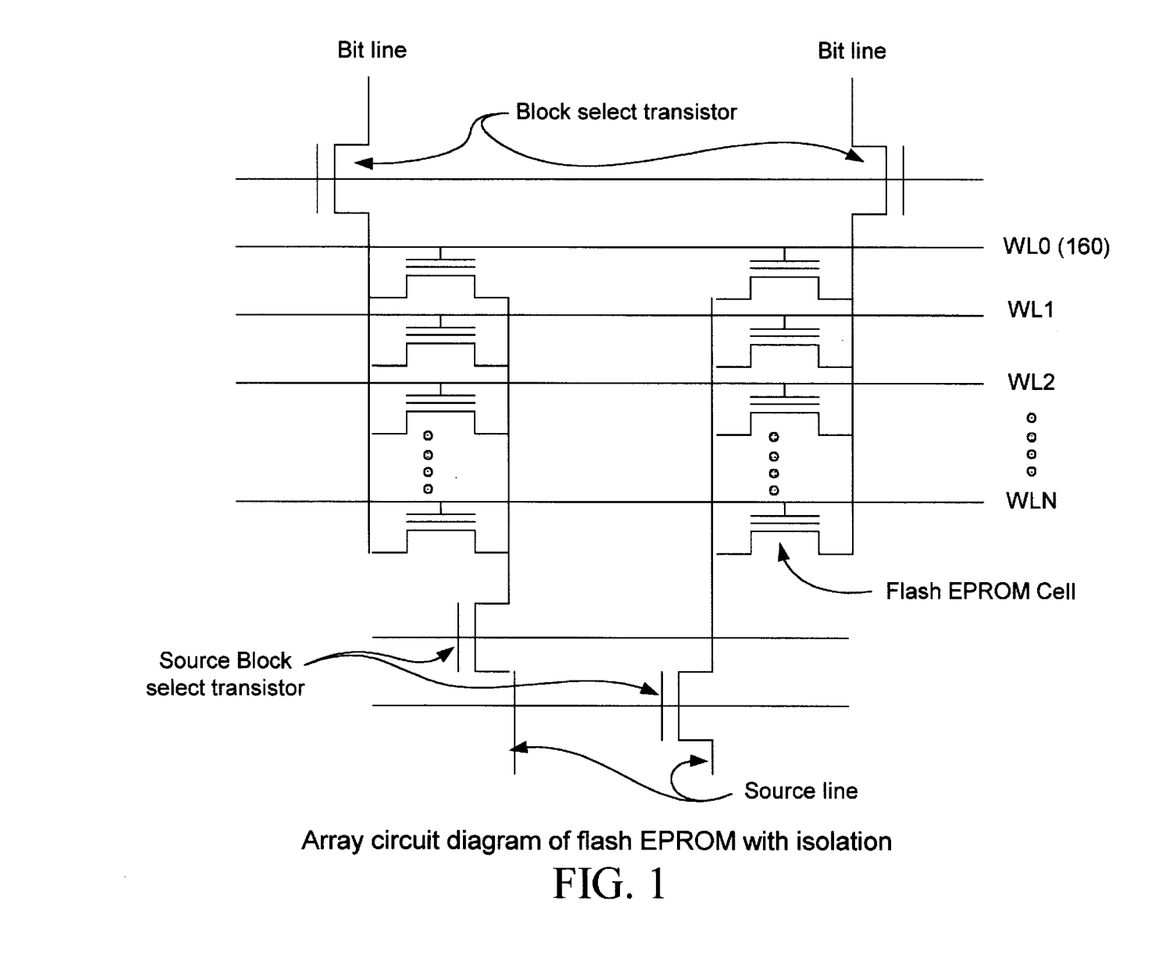
FIG. 1 shows a schematic diagram of a nonvolatile memory device which may be manufactured using the method of the present invention.

FIG. 1 shows a schematic diagram of a nonvolatile memory device which may be manufactured using the method of the present invention.

FIGS. 1A–1K show one embodiment of a method of the present invention for fabricating a nonvolatile memory device with isolation.

Figure 1A:
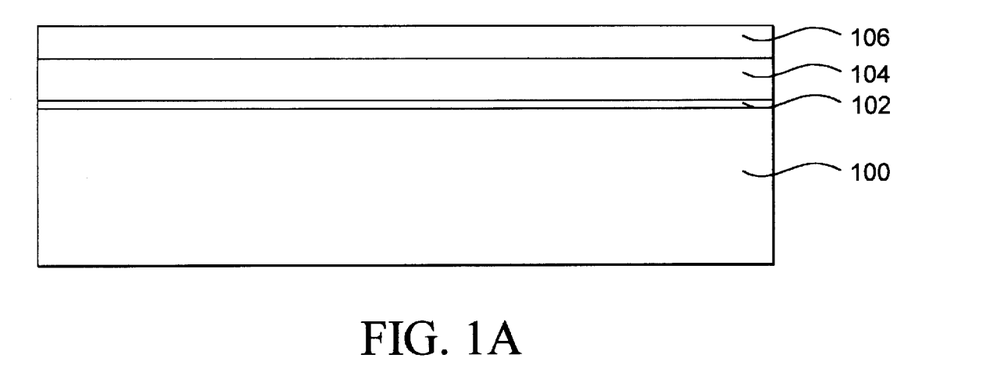
FIGS 1A–1K show one embodiment of a method of the present invention fabricating a nonvolatile memory device with isolation.

FIG. 1A shows a multilayer structure. Multilayer structure includes a substrate 100, a tunnel oxide layer 102, a polysilicon layer 104, and an etch stop layer 106. Substrate 100 may be a silicon substrate such as a p-type silicon substrate.

Tunnel oxide layer 102 is formed over substrate 100. Tunnel oxide layer 102 may be silicon dioxide grown on substrate 100. Tunnel oxide layer 102 may be formed to a thickness of about 5 nm to 20 nm over substrate 100 in the area of the memory array.

Polysilicon layer 104 is formed over tunnel oxide layer 102. Polysilicon layer 104 may be formed, for example, using standard CVD (chemical vapor deposition) processes with a temperature of about 620° C., an ambient pressure of about 0.3 torr using silane gas with a flow rate of about 280 sccm to a thickness of about 20–200 nm.

Etch stop layer 106 is formed over polysilicon layer 104. Etch stop layer 106 may be a nitride film, or a silicon dioxide layer. A silicon dioxide layer may be formed, for example, as a thermal oxide, or by CVD. An example of suitable CVD conditions for forming the oxide is a pressure of 0.82 torr, a temperature of 800° C., and using a flow rate of about 100 sccm. In one embodiment, silicon dioxide layer has a thickness of about 2–100 nm. In another embodiment, silicon dioxide layer has a thickness of about 50–100 nm.

Figure 1B:
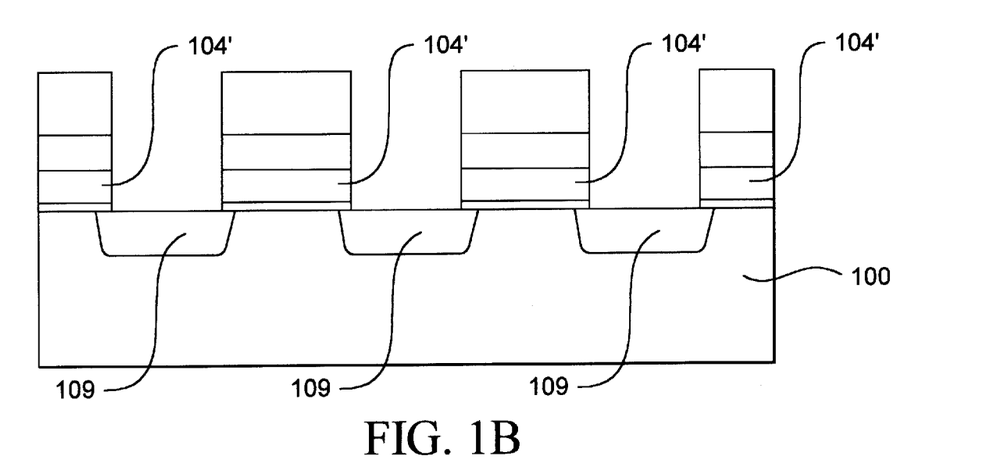

FIG. 1B shows the etching of the multilayer structure to form gates 104' and the creation of implanted regions 109 in substrate 100. To form gates 104', a photoresist mask layer 108 is first formed over etch stop layer 106. The appropriate portions of etch stop layer 106, polysilicon layer 104, and tunnel oxide 102 are etched away to expose substrate 100 and form gates 104'. The etch process may be a plasma or reactive ion etch. Implanted regions 109 are created by doping substrate 100 with arsenic or other doping material. Photoresist mask layer 108 is then removed.

Figure 1C:
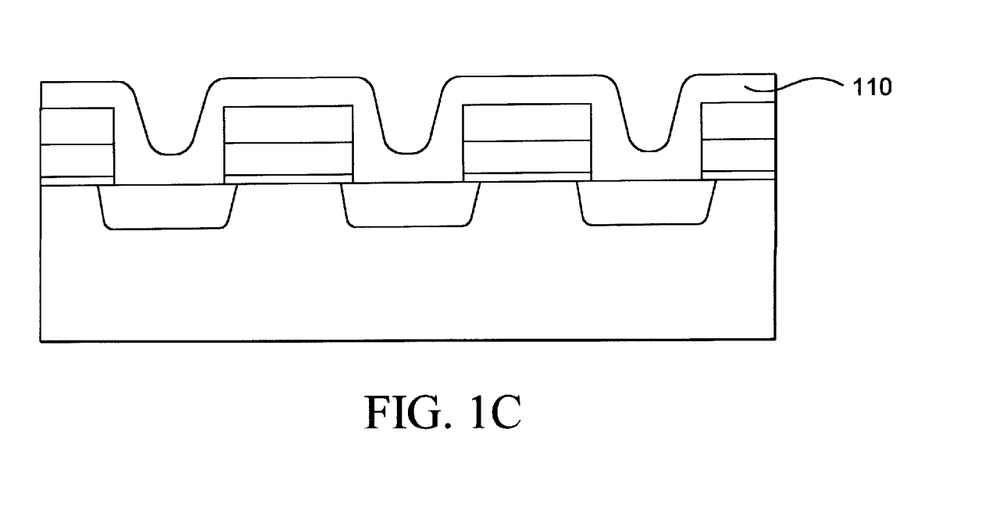

FIG. 1C shows the formation of an spacer layer 110 over the area of the memory array. Spacer layer 110 may be an oxide layer or a $Si_3N_4$ layer.

Figure 1D:
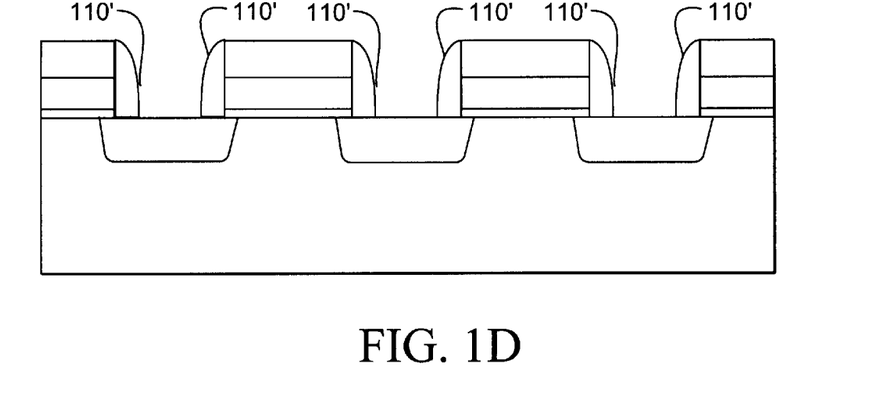

FIG. 1D shows the formation of sidewall spacers 110'. Spacer layer 110 is etched to form sidewall spacers 110' using a selective etching process.

Figure 1E:
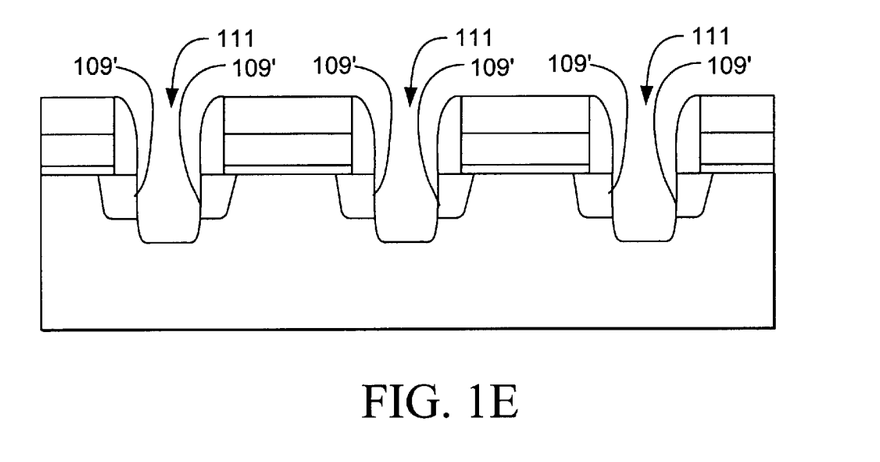

FIG. 1E shows the formation of trenches 111 between gates 104'. Sidewall spacers 110' serve to partition implanted regions 109 into source/drain regions 109' and an area in which a trench 111 will be formed. Trenches 111 may be formed using a highly selective etch process which etches substrate 100 much faster than etch stop layer 108 and sidewall spacers 110'. The etch process may be performed, for example, in the presence of $O_2$ and HBr in the presence of $Cl_2$/He at a pressure of about 5–60 m torr and at a power of about 100–300 W. The depth of trenches 111 may be about 0.3–0.5 $\mu$m for a device using a similar critical dimension width as the polysilicon lines.

Figure 1F:
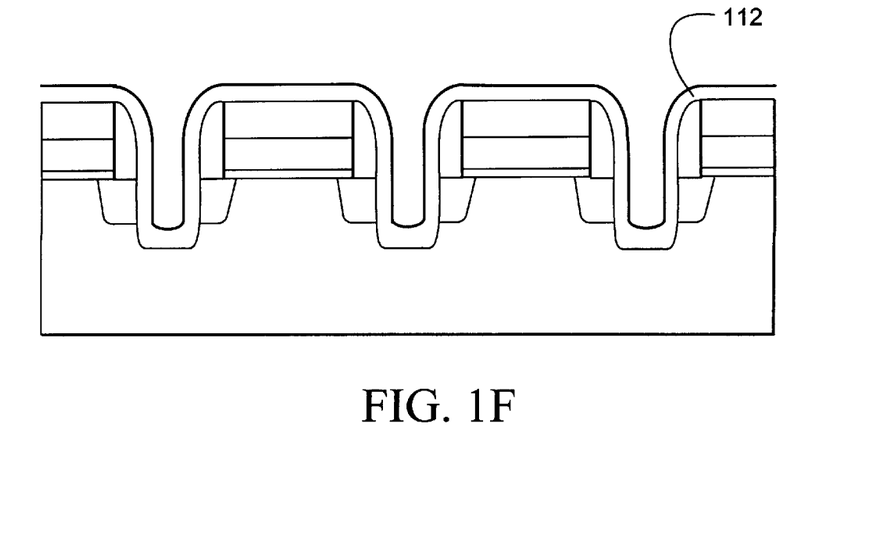

FIG. 1F shows the formation of a conductive layer 112 over the area of the memory array. Conductive layer 112 is formed over the area of the memory array, including the areas over the sidewalls and bottoms of trenches 111. Conductive layer 112 may be doped polysilicon or metal film, such as $WSi_x$, W, an Al—Si alloy, an Al—Cu alloy, or an Al—Si—Cu alloy. Conductive layer 112 may be deposited using a CVD process.

Figure 1G:
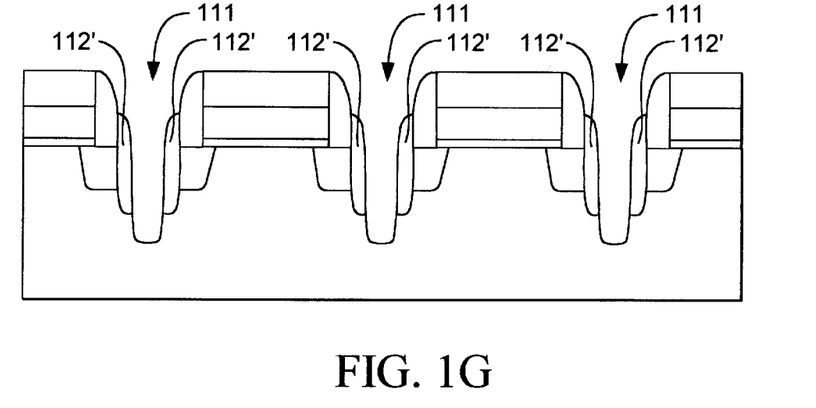

FIG. 1G shows the formation of isolation trenches 111' for devices with isolation and the formation of reduced resistance diffusion regions 112'. Conductive layer 112 is removed from the top of gates 104', and through trenches 111 down to the bottoms of trenches 111, leaving reduced resistance diffusion regions 112' along the sidewalls of isolation trenches 111'. Conductive layer 112 may be removed using an anisotropy etch. Reduced resistance diffusion regions 112' are thus formed. The deposition of conductive layer 112 allows thicker diffusion regions 112' to be formed along the sidewalls of isolation trenches 111' and adjacent to source/drain regions 109'.

To increase the conductivity of the trench sidewalls, an angled implantation process is sometimes used to dope the sidewalls to increase conductivity. However, implantation process cannot achieve the diffusion region thicknesses that are possible with the use of a conductive layer 112. Implantation processes are only able to achieve diffusion region thicknesses of approximately 0.05–0.5 $\mu$m versus the diffusion region thicknesses of approximately 0.05–2.0 $\mu$m possible with the method of the present invention. Implantation process are only able to achieve sheet resistances of 50–1000 ohms per square versus the sheet resistances of 1–10 ohms per square possible with the method of the present invention. For example, the use of $WSi_x$ as the conductive layer produces sheet resistances 10 times less as compared to doped junctions using arsenic or boron.

In addition, implantation processes require a drying process which increases the number of thermocycles to which the device is subjected and adversely affects device yield and performance. Using a conductive layer 112 to form reduced resistance diffusion regions 112' does not require a drying process, thus reducing the number of thermocycles to which the device is subjected.

Figure 1H:
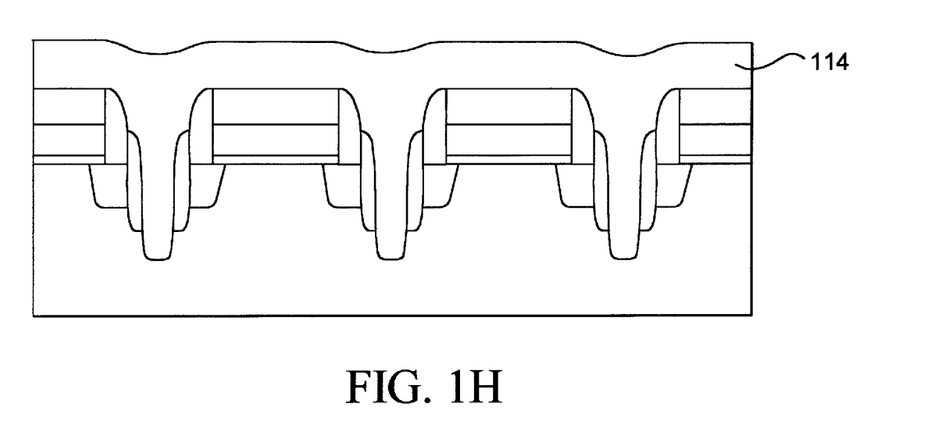

FIG. 1H shows the filling of isolation trenches 111' with an insulation material 114. Insulation material 114 may be an oxide. Insulation material may be deposited, using a CVD process using a mixture of $N_2O/SiH_2Cl_2$ with a flow rate of about 90–180 sccm at about 800° C. with an ambient pressure of about 0.4 torr. The deposition time for this process is proportional to the oxide thickness. Alternatively, a TEOS (tetraethylorthosilicate) process may be applied, using a commercial TEOS material with a flow rate of about 100 sccm at about 700° C. with an ambient pressure of about 0.82 torr.

Figure 1I:
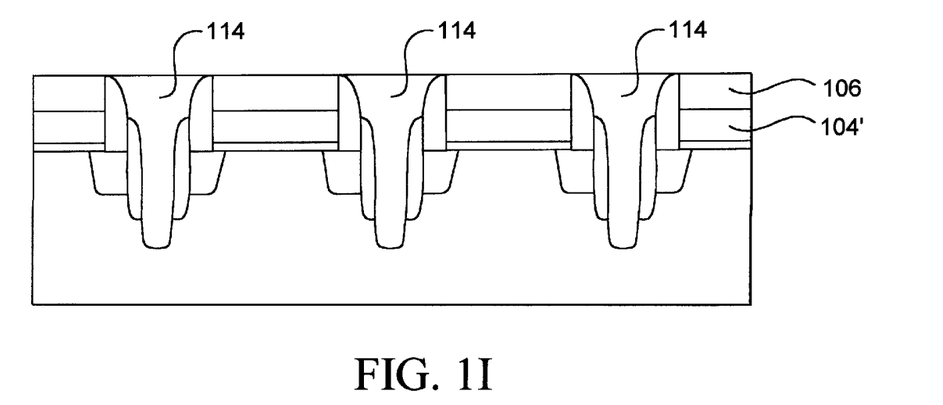

FIG. 1I shows the removal of insulation material 114 down to the top of etch stop layer 106. This planarizes the regions between gates 104'. Insulation material 114 may be removed using CMP (chemical mechanical polishing).

Figure 1J:
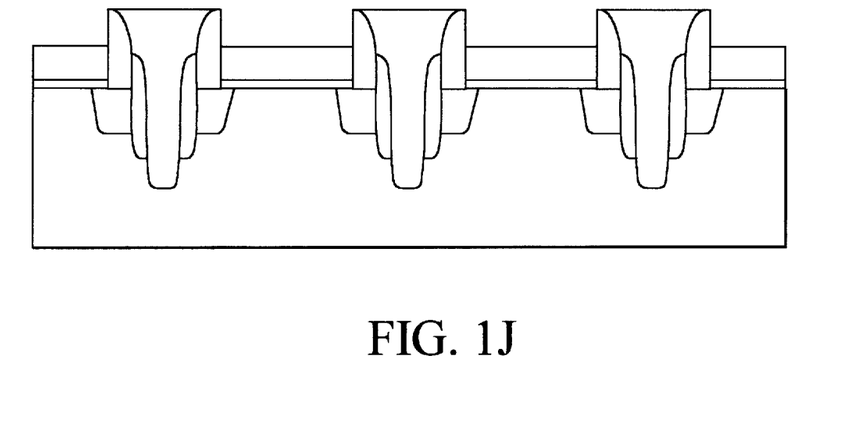

FIG. 1J shows the removal of etch stop layer 106. Etch stop layer 106 may be removed using a wet etch.

Figure 1K:
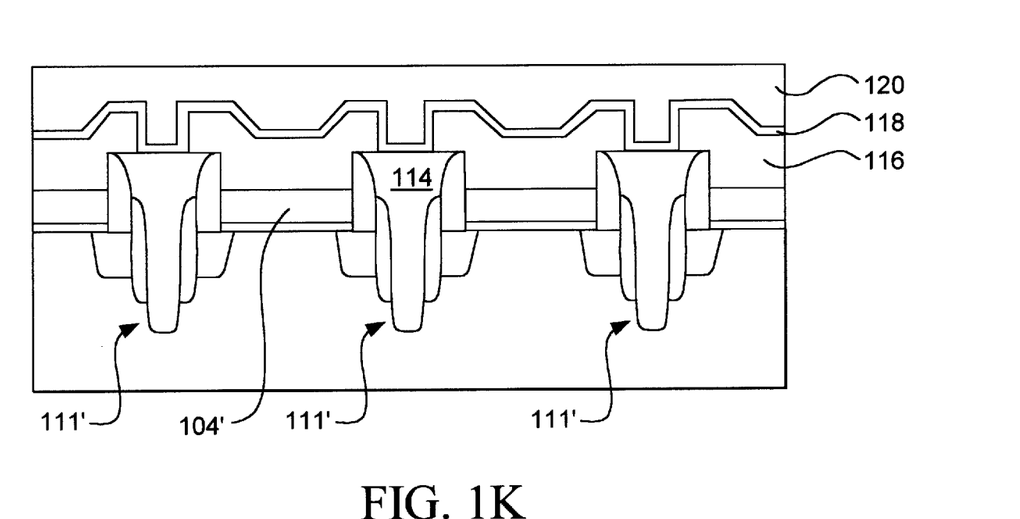

FIG. 1K shows the formation of polysilicon lines 116 over polysilicon layer 10X. Polysilicon layer 116 is then formed over gates 104'. Polysilicon layer 116 may be of lightly doped polysilicon, and are slightly wider than gates 104' in order to extend the area of the floating gate structure. This polysilicon wing structure increases the gate coupling ratio. An interpoly dielectric layer 118, such as an ONO (oxide/nitride/oxide) layer, is formed over polysilicon layer 116 as an inter-poly insulator. A mask/etch process is applied to form the floating gate structures and word lines in lines along a direction substantially orthogonal to trenches 111. Polysilicon layer 120 is deposited over interpoly dielectric layer 118 as a control word-line.

Figure 2:
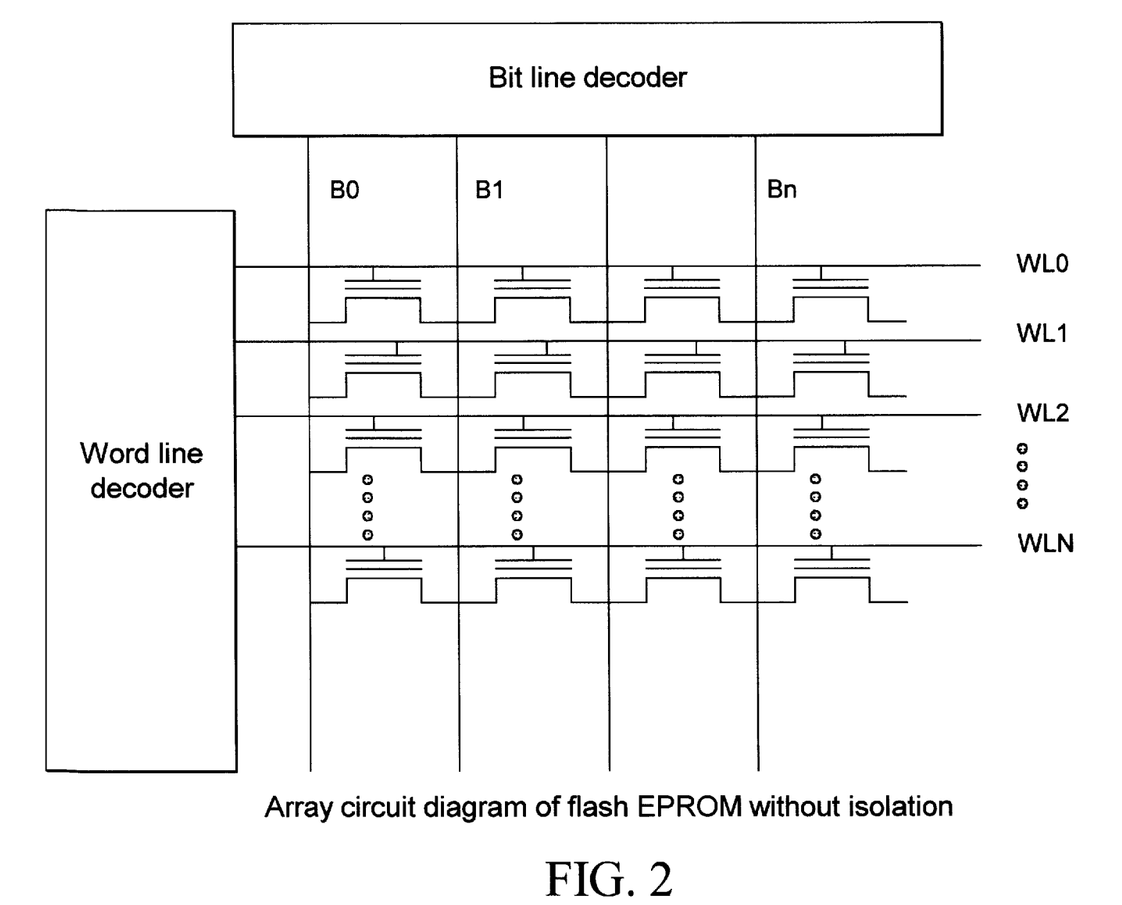
FIG. 2 shows a schematic diagram of a nonvolatile memory device which may be manufactured using the method of the present invention.

FIG. 2 shows a schematic diagram of a nonvolatile memory device which may be manufactured using the method of the present invention.

FIGS. 2A–2K show one embodiment of a method of the present invention for fabricating a nonvolatile memory device without isolation.

Figure 2A:
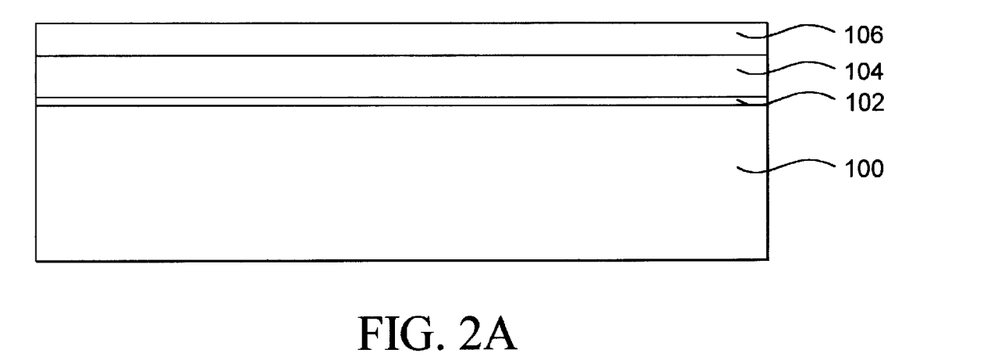
FIGS. 2A–2K show one embodiment of a method of the present invention for fabricating a nonvolatile memory device without isolation.

FIG. 2A shows a multilayer structure. Multilayer structure includes a substrate 100, a tunnel oxide layer 102, a polysilicon layer 104, and an etch stop layer 106. Substrate 100 may be a silicon substrate such as a p-type silicon substrate.

Tunnel oxide layer 102 is formed over substrate 100. Tunnel oxide layer 102 may be silicon dioxide grown on substrate 100. Tunnel oxide layer 102 may be formed to a thickness of about 5 nm to 20 nm over substrate 100 in the area of the memory array.

Polysilicon layer 104 is formed over tunnel oxide layer 102. Polysilicon layer 104 may be formed, for example, using standard CVD (chemical vapor deposition) processes with a temperature of about 620° C., an ambient pressure of about 0.3 torr using silane gas with a flow rate of about 280 sccm to a thickness of about 20–200 nm.

Etch stop layer 106 is formed over polysilicon layer 104. Etch stop layer 106 may be a nitride film, or a silicon dioxide layer. A silicon dioxide layer may be formed, for example, as a thermal oxide, or by CVD. An example of suitable CVD conditions for forming the oxide is a pressure of 0.82 torr, a temperature of 800° C., and using a flow rate of about 100 sccm. In one embodiment, silicon dioxide layer has a thickness of about 2–100 nm. In another embodiment, silicon dioxide layer has a thickness of about 50–100 nm.

Figure 2B:
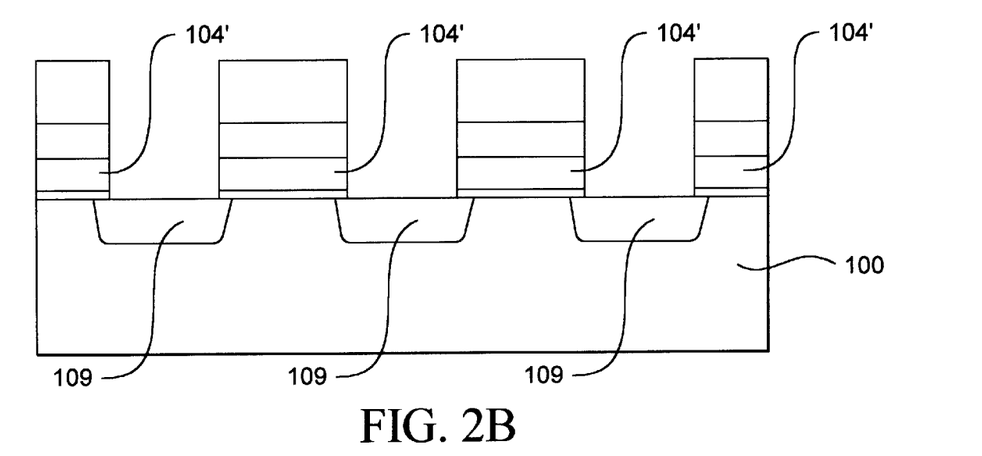

FIG. 2B shows the etching of the multilayer structure to form gates 104' and the creation of implanted regions 109 in substrate 100. To form gates 104', a photoresist mask layer 108 is first formed over etch stop layer 106. The appropriate portions of etch stop layer 106, polysilicon layer 104, and tunnel oxide 102 are etched away to expose substrate 100 and form gates 104'. The etch process may be a plasma or reactive ion etch. Implanted regions 109 are created by doping substrate 100 with arsenic or other doping material. Photoresist mask layer 108 is then removed.

Figure 2C:
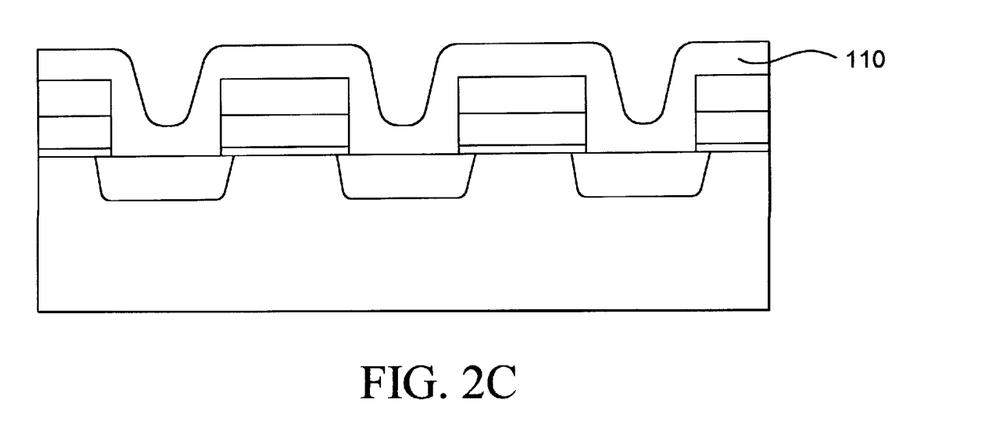

FIG. 2C shows the formation of a spacer layer 110 over the area of the memory array. Spacer layer 110 may be an oxide layer or a $Si_3N_4$ layer.

Figure 2D:
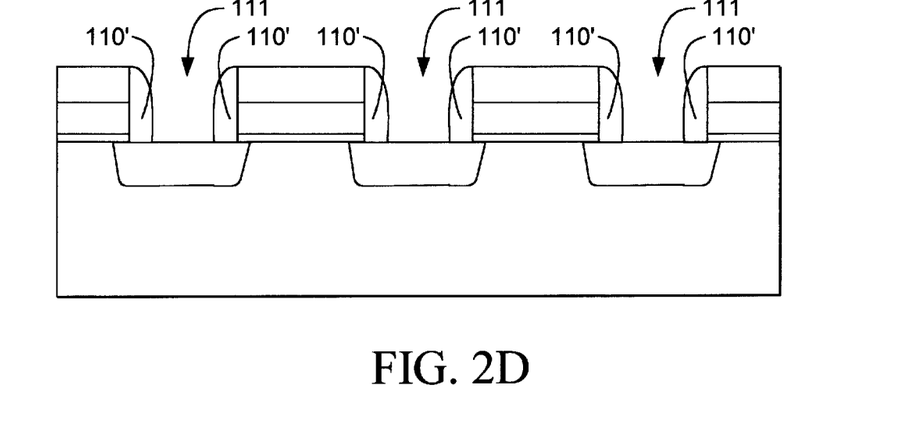

FIG. 2D shows the formation of sidewall spacers 110'. Spacer layer 110 is etched to form sidewall spacers 110' using a selective etching process.

Figure 2E:
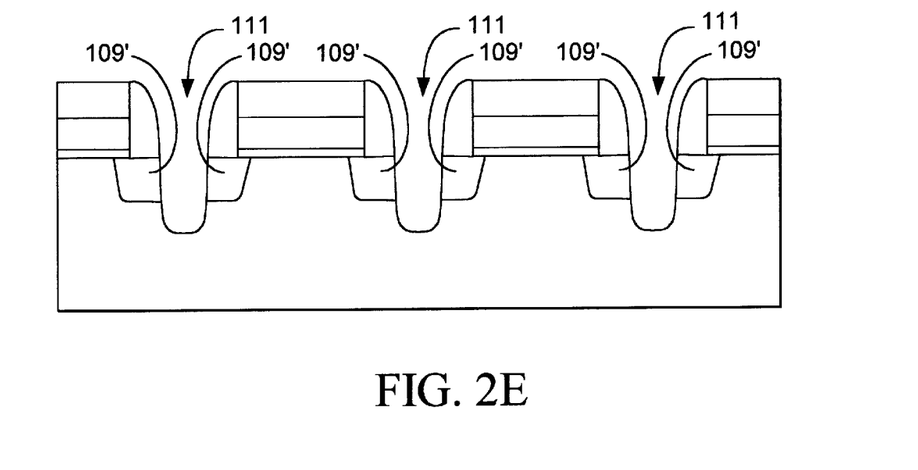

FIG. 2E shows the formation of trenches 111 between gates 104'. Sidewall spacers 110' serve to partition implanted regions 109 into source/drain regions 109' and an area in which a trench 111 will be formed. Trenches 111 may be formed using a highly selective etch process which etches substrate 100 much faster than etch stop layer 108 and sidewall spacers 110'. The etch process may be performed, for example, in the presence of $O_2$ and HBr in the presence of $Cl_2$/He at a pressure of about 5–60 m torr and at a power of about 100–300 W. The depth of trenches 111 may be about 0.3–0.5 μm for a device using a similar critical dimension width as the polysilicon lines.

Figure 2F:
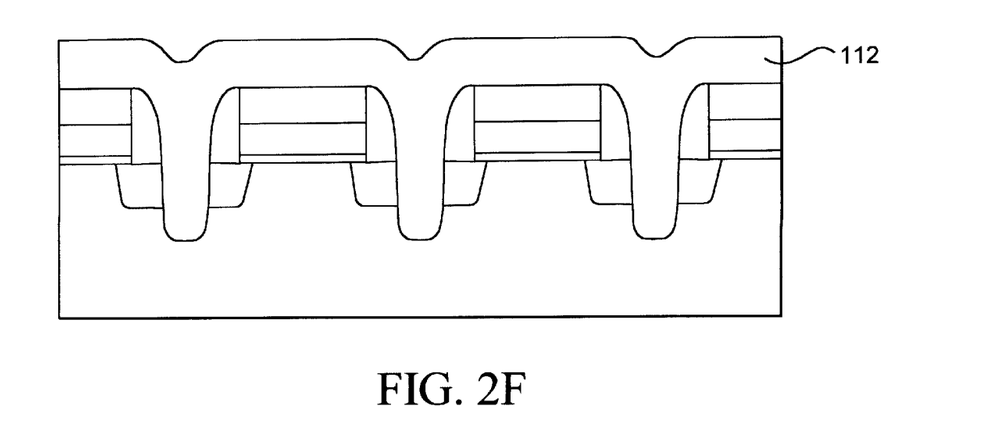

FIG. 2F shows the formation of a conductive layer 112 over the area of the memory array. Conductive layer 112 is formed over the area of the memory array, filling trenches 111. Conductive layer 112 may be doped polysilicon or metal film, such as $WSi_x$, W, an Al—Si alloy, an Al—Cu alloy, or an Al—Si—Cu alloy. Conductive layer 112 may be deposited using a CVD process.

Figure 2G:
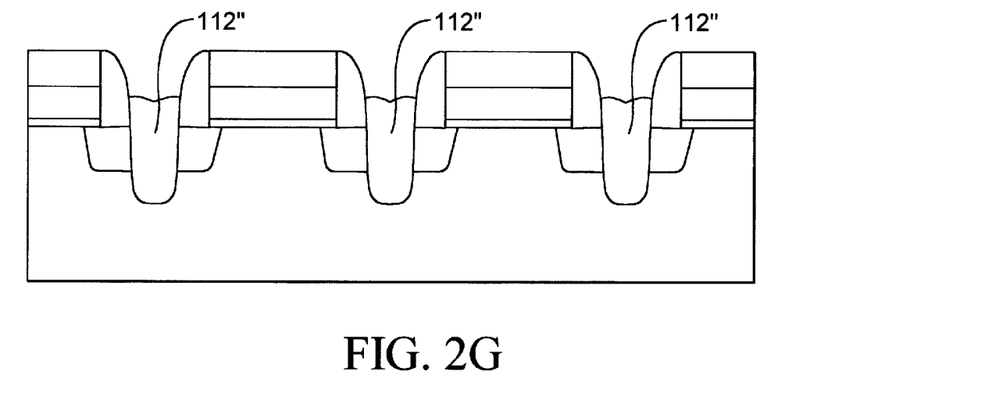

FIG. 2G shows the formation of non-isolation trenches 111" for devices without isolation and the formation of reduced resistance diffusion regions 112'. Conductive layer 112 is removed from the top of gates 104', and partially from trenches 111, leaving reduced resistance diffusion regions 112" in trenches 111. Conductive layer 112 may be removed using an anisotropy etch. Reduced resistance diffusion regions 112" are thus formed. The deposition of conductive layer 112 allows larger diffusion regions 112" to be formed within trenches 111 and adjacent to source/drain regions 109'.

Figure 2H:
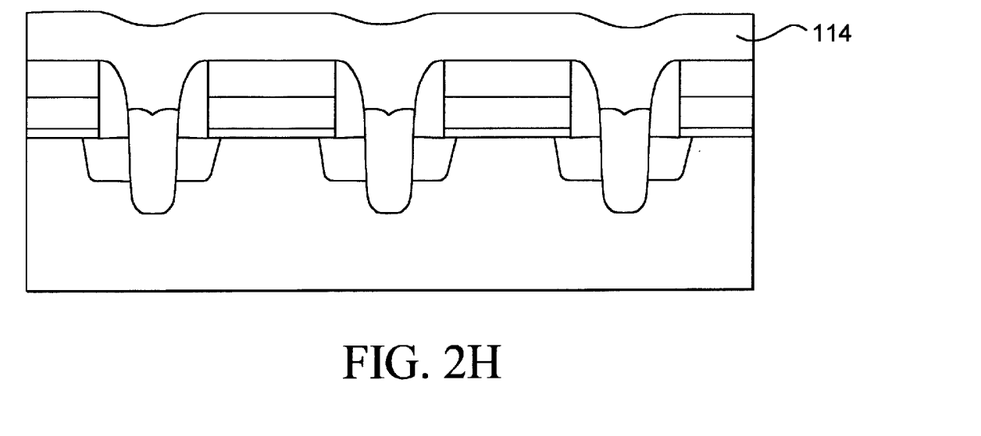

FIG. 2H shows the filling of non-isolation trenches 111" with an insulation material 114. Insulation material 114 may be an oxide. Insulation material may be deposited, using a CVD process using a mixture of $N_2O/SiH_2Cl_2$ with a flow rate of about 90–180 sccm at about 800° C. with an ambient pressure of about 0.4 torr. The deposition time for this process is proportional to the oxide thickness. Alternatively, a TEOS (tetraethylorthosilicate) process may be applied, using a commercial TEOS material with a flow rate of about 100 sccm at about 700° C. with an ambient pressure of about 0.82 torr.

Figure 2I:
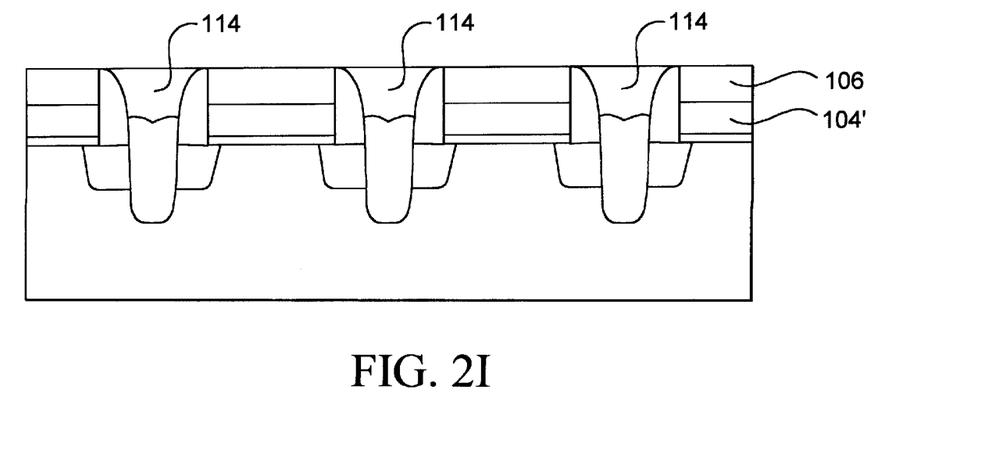

FIG. 2I shows the removal of insulation material 114 down to the top of etch stop layer 106. This planarizes the regions between gates 104'. Insulation material 114 may be removed using CMP (chemical mechanical polishing).

Figure 2J:
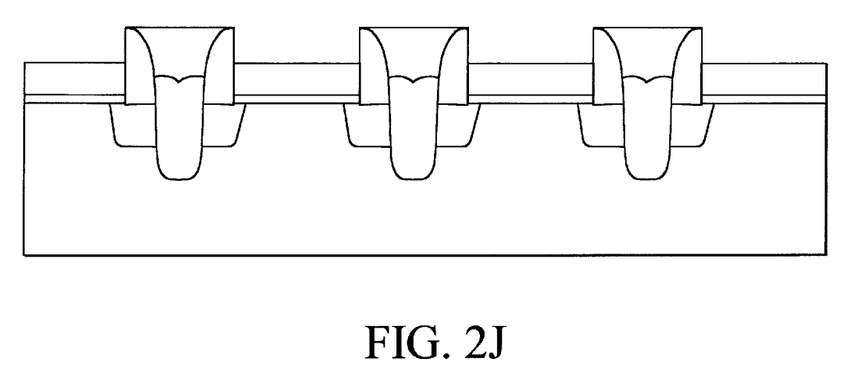

FIG. 2J shows the removal of etch stop layer 106. Etch stop layer 106 may be removed using a wet etch.

Figure 2K:
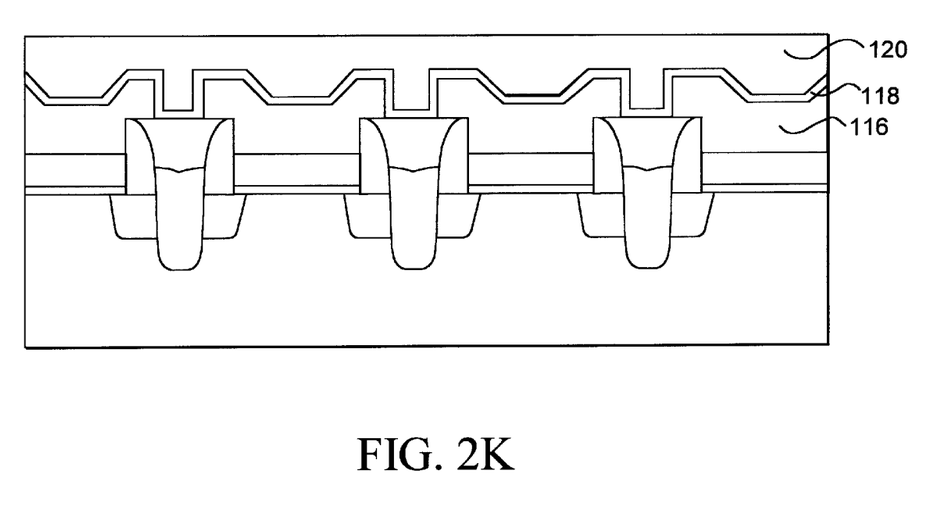

FIG. 2K shows the formation of polysilicon lines 116 over polysilicon layer 10X. Polysilicon layer 116 is then formed over gates 104'. Polysilicon layer 116 may be of lightly doped polysilicon, and are slightly wider than gates 104' in order to extend the area of the floating gate structure. This polysilicon wing structure increases the gate coupling rate. An interpoly dielectric layer 118, such as an ONO (oxide/nitride/oxide) layer, is formed over polysilicon layer 116 as an inter-poly insulator. A mask/etch process is applied to form the floating gate structures and word lines in lines along a direction substantially orthogonal to trenches 111. Polysilicon layer 120 is deposited over interpoly dielectric layer 118 as a control word-line.

The foregoing description of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for manufacturing a nonvolatile memory device, comprising:

providing a multilayer structure, the multilayer structure having a substrate, a tunnel oxide layer over the substrate, a polysilicon layer over the tunnel oxide layer, and an etch stop layer over the polysilicon layer;

defining gates in the multilayer structure by using a photoresist mask layer to remove portions of the etch stop layer, polysilicon layer, and tunnel oxide layer to form openings in the multilayer structure;

creating source/drain regions in the substrate by doping the substrate through the openings;

forming sidewall spacers adjacent to the gates by forming a spacer layer in the openings and etching back the spacer layer, the sidewall spacers defining source regions, drain regions, and trench regions;

forming source/drain trenches by removing portions of the substrate in the trench regions, the trenches extending deeper into the substrate than the source/drain regions;

depositing a conductive material on sidewalls and bottoms of the source/drain trenches;

removing the conductive material from the bottoms of the source/drain trenches and forming isolation trenches in the bottoms of said source/drain trenches, leaving the conductive material continuous with the source/drain regions on sides of said source/drain trenches; and filling the isolation trenches with an insulating material.

2. The method of claim 1, wherein depositing a conductive material is performed by chemical vapor deposition.

3. The method of claim 1, wherein the conductive material is doped polysilicon.

4. The method of claim 1, wherein the conductive material is a metal.

5. The method of claim 1, wherein the conductive material is $WSi_x$.

6. The method of claim 1, wherein the conductive material is tungsten.

7. The method of claim 1, wherein the conductive material is an alloy of aluminum and silicon.

8. The method of claim 1, wherein the conductive material is an alloy of aluminum and copper.

9. The method of claim 1, wherein the conductive material is an alloy of aluminum, silicon, and copper.

10. A method for manufacturing a nonvolatile memory device, comprising:

providing a multilayer structure, the multilayer structure having a substrate, a tunnel oxide layer over the substrate, a polysilicon layer over the tunnel oxide layer, and an etch stop layer over the polysilicon layer;

defining gates in the multilayer structure by using a photoresist mask layer to remove portions of the etch stop layer, polysilicon layer, and tunnel oxide layer and form openings in the multilayer structure;

creating source/drain regions in the substrate by doping the substrate through the openings;

forming sidewall spacers adjacent to the gates by forming a spacer layer in the openings and etching back the spacer layer, the sidewall spacers defining source regions, drain regions, and trench regions;

forming source/drain trenches by removing portions of the substrate in the trench regions, the source/drain trenches extending deeper into the substrate than the source/drain regions;

at least partially filling the source/drain trenches with a conductive polysilicon material, the conductive polysilicon material being continuous with, and extending the sizes of, the source/drain regions; and covering the conductive material with an insulating material.

11. The method of claim 1, wherein depositing a conductive material is performed by chemical vapor deposition.

12. The method of claim 1, wherein the conductive material is doped polysilicon.

13. The method of claim 1, wherein the conductive material is a metal.

14. The method of claim 1, wherein the conductive material is $WSi_x$.

15. The method of claim 1, wherein the conductive material is tungsten.

16. The method of claim 1, wherein the conductive material is an alloy of aluminum and silicon.

17. The method of claim 1, wherein the conductive material is an alloy of aluminum and copper.

18. The method of claim 1, wherein the conductive material is an alloy of aluminum, silicon, and copper.

* * * * *